/

US007691751B2

(12) United States Patent
Min et al.

(10) Patent No.: US 7,691,751 B2
(45) Date of Patent: Apr. 6, 2010

(54) SELECTIVE SILICIDE FORMATION USING RESIST ETCHBACK

(75) Inventors: Kyunghoon Min, Palo Alto, CA (US);
Angela Hui, Fremont, CA (US);
Hiroyuki Kinoshita, San Jose, CA (US);
Ning Cheng, San Jose, CA (US); Mark Chang, Los Altos, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/924,823

(22) Filed: Oct. 26, 2007

(65) Prior Publication Data

US 2009/0111265 A1 Apr. 30, 2009

(51) Int. Cl.
*H01L 21/4763* (2006.01)
(52) U.S. Cl. .............................. 438/682; 257/E21.495
(58) Field of Classification Search ................. 438/682; 257/E21.495
See application file for complete search history.

(56) References Cited

U.S. PATENT DOCUMENTS

| 6,025,267 | A | 2/2000 | Pey et al. | |
|---|---|---|---|---|
| 6,548,357 | B2 * | 4/2003 | Weybright et al. | 438/279 |
| 6,888,176 | B1 * | 5/2005 | Horch et al. | 257/107 |
| 2002/0132430 | A1 | 9/2002 | Willer et al. | |
| 2004/0014328 | A1 | 1/2004 | Maki | |
| 2004/0074867 | A1 * | 4/2004 | Han et al. | 216/2 |
| 2007/0201275 | A1 * | 8/2007 | Takeuchi et al. | 365/185.17 |
| 2008/0169501 | A1 * | 7/2008 | Yang et al. | 257/321 |

FOREIGN PATENT DOCUMENTS

| EP | 0928023 | 7/1999 |
|---|---|---|
| EP | 0975020 | 1/2000 |

OTHER PUBLICATIONS

International Search Report for International Application No. PCT/US2008/080636 dated Jan. 30, 2009.
Written Opinion of the International Searching Authority for International Application No. PCT/US2008/080636 dated Jan. 30, 2009.

* cited by examiner

*Primary Examiner*—Matthew Smith
*Assistant Examiner*—Walter H Swanson
(74) *Attorney, Agent, or Firm*—Turocy & Watson, LLP

(57) ABSTRACT

Methods of selectively forming metal silicides on a memory device are provided. The methods can include forming a mask layer over the memory device; forming a patterned resist over the mask layer; removing upper portions of the patterned resist; forming a patterned mask layer by removing portions of the mask layer that are not covered by the patterned resist; and forming metal silicides on the memory device by a chemical reaction of a metal layer formed on the memory device with portions of the memory device that are not covered by the patterned mask layer. By preventing silicidation of underlying silicon containing layers/components of the memory device that are covered by the patterned mask layer, the methods can selectively form the metal silicides on the desired portions of the memory device.

20 Claims, 7 Drawing Sheets

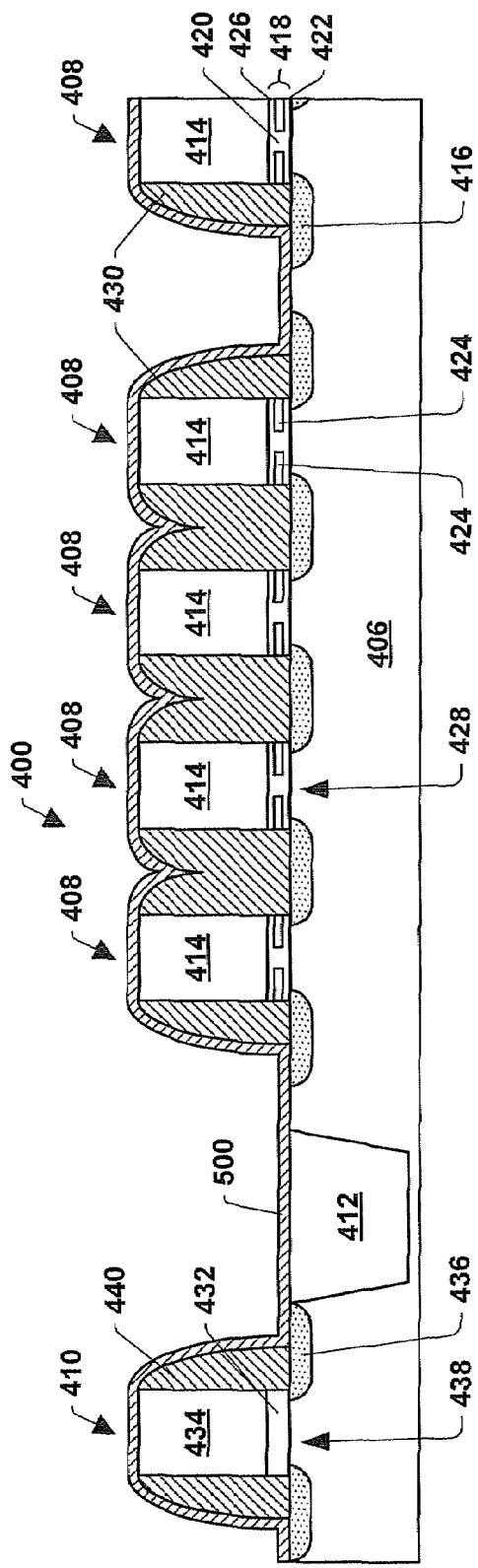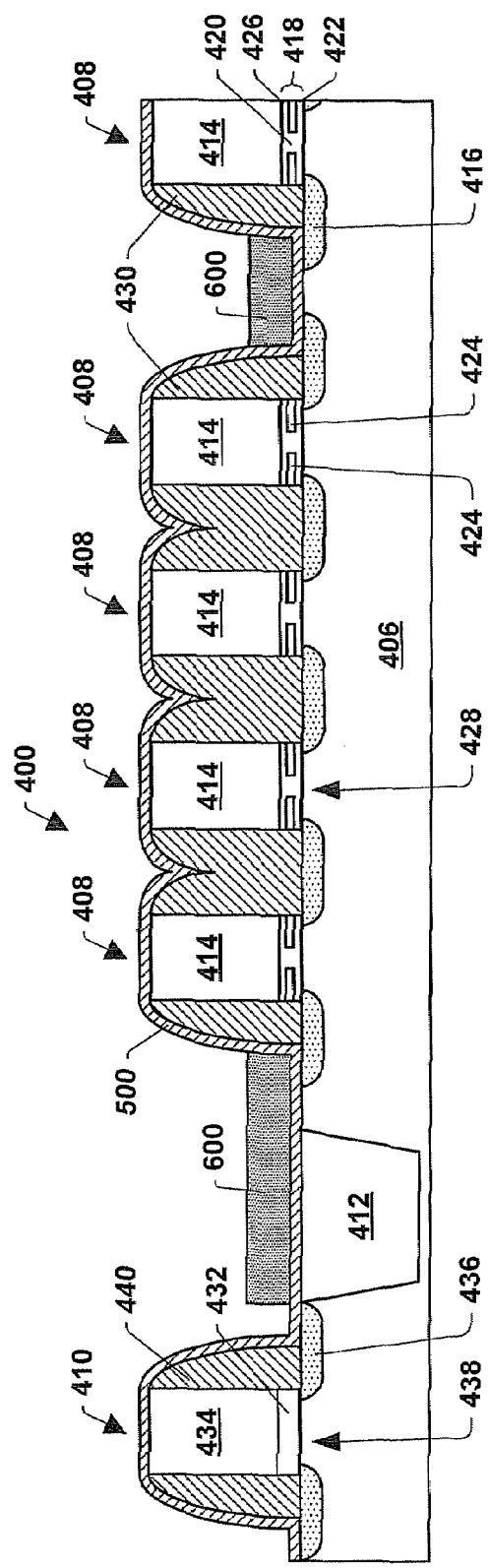

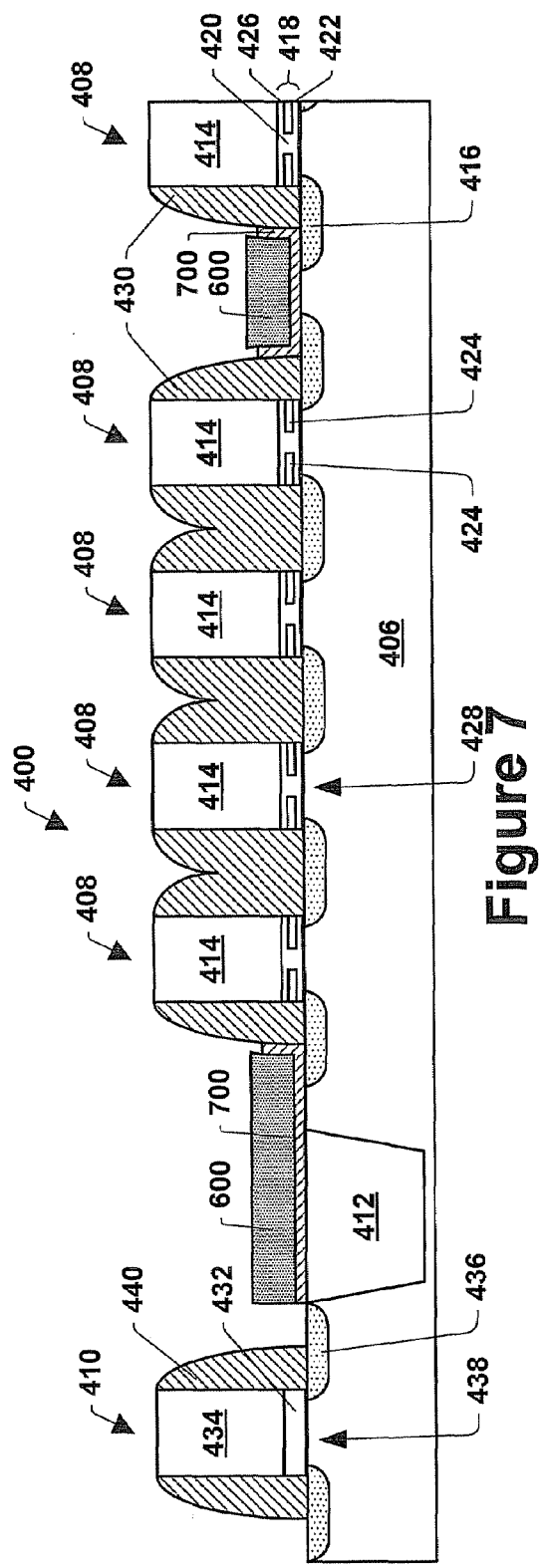
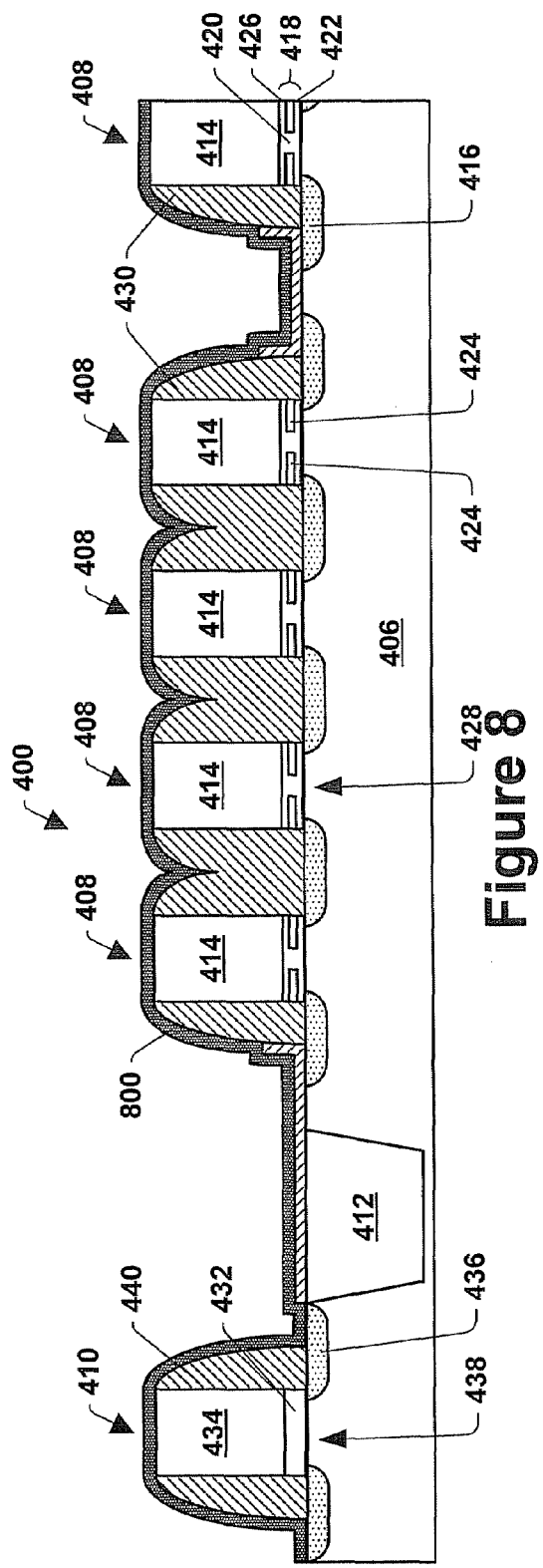

SELECTIVE SILICIDE FORMATION USING RESIST ETCHBACK

TECHNICAL FIELD

Described are methods of selectively forming silicides on memory devices.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as scaling down device dimensions, sheet resistivity of electrically conductive component of the memory devices (e.g., gates, drain and source regions, emitters of bipolar transistors, local interconnect regions, and interconnect lines) may limit the speed at which memory devices can operate.

To reduce the sheet resistivity of memory devices, a layer of metal silicide can be formed over the surface of electrically conductive component of the memory devices. The resultant silicided components provide the lower resistivity of a metal silicide. While silicides are useful for reducing the sheet resistivity of memory devices, formation of silicides may interfere with the operation of analog circuits by providing undesirable junction leakage. Thus, the requirement of small features with close spacing between adjacent features requires sophisticated manufacturing techniques.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides methods of selectively forming metal silicides on memory devices. The methods can include forming a mask layer over the memory device; forming a patterned resist over the mask layer; removing upper portions of the patterned resist; forming a patterned mask layer by removing portions of the mask layer that are not covered by the patterned resist; and forming metal silicides on the memory device by a chemical reaction of a metal layer formed on the memory device with portions of the memory device that are not covered by the patterned mask layer. By preventing silicidation of underlying silicon containing layers/components of the memory device that are covered by the patterned mask layer, the methods can selectively form the metal silicides on the desired portions of the memory device.

To the accomplishment of the foregoing and related ends, the invention, then, contains the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 illustrates forming a mask layer over a memory device in accordance with an aspect of the subject invention.

FIG. 6 illustrates forming a patterned resist over portions of a memory device in accordance with an aspect of the subject invention.

FIG. 7 illustrates forming a patterned mask layer in accordance with an aspect of the subject invention.

FIG. 8 illustrates forming a metal layer over a memory device in accordance with an aspect of the subject invention.

DETAILED DESCRIPTION

Figure 1:
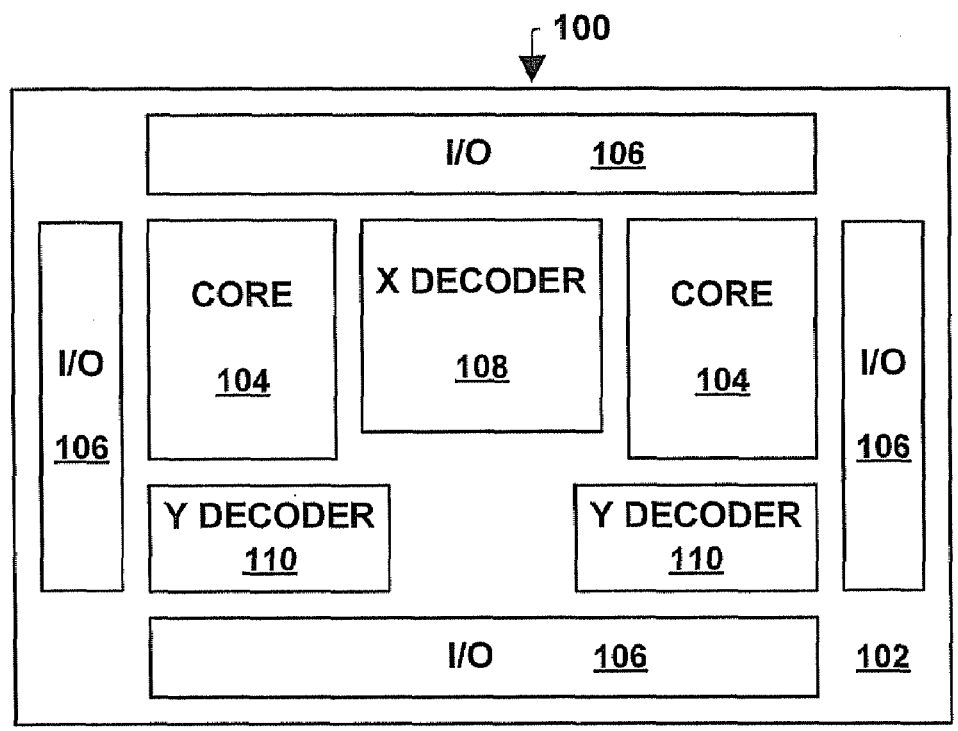
FIG. 1 is a top view of an exemplary memory device in accordance with an aspect of the subject invention.

The innovation described herein provides methods for forming silicided and non-silicided layers/components on silicon containing layers/components of memory devices by utilizing a patterned mask layer. The patterned mask layer is formed on the memory device, and then a metal layer is formed over the memory device. The patterned mask layer cover portions of the memory device, and the covered portions of the memory device are protected from silicide formation. Uncovered portions of the memory device by the patterned mask layer can contact and react with the metal layer, thereby forming metal silicides.

In one embodiment, sidewall spacers adjacent lateral sidewalls of, for example, gates are also employed to prevent silicide formation. When such a sidewall spacer is employed, the mask layer can contain a material that is different from a material of the sidewall spacer. Therefore, after the silicide formation, the patterned mask layer can be removed from the memory device without substantially damaging the sidewall spacer.

The metal silicides formed on bit lines can significantly reduce the contact resistance to the bit lines. Also, the metal silicides formed on gate electrodes can significantly reduce the resistance of the gate structure, as compared to a polysilicon gate. As a result, the overall conductivity of the gate electrodes can be increased. The innovation described herein therefore effectively addresses the concerns raised by the trend towards the miniaturization of memory devices.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the innovation.

Although the selective silicide formation can be applied to any type of memory device, the innovation is hereinafter illustrated and described in the context of an exemplary semiconductor device having one or more memory arrays containing dual bit memory cells arranged in a virtual ground type array architecture. FIG. 1 illustrates a top view of an exemplary dual bit flash memory device 100. The memory device 100 generally includes a silicon substrate 102 in which one or more high-density core regions 104 and one or more lower-density peripheral regions are formed. The high-density core regions 104 typically include one or more M by N arrays of individually addressable, substantially identical dual bit memory cells. The lower-density peripheral regions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
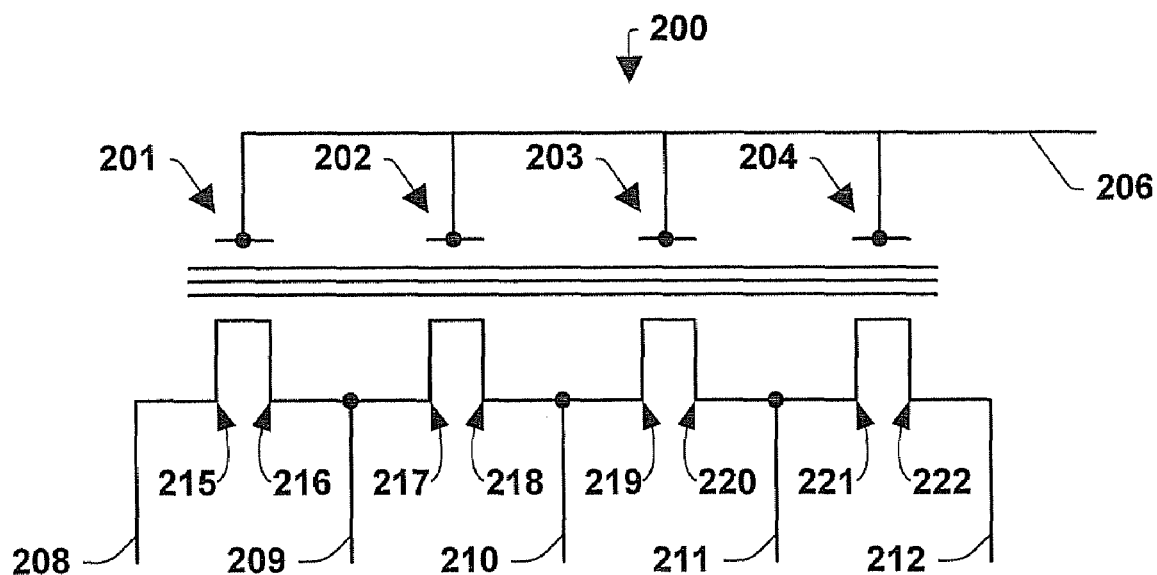
FIG. 2 is a schematic illustration of a portion of a memory core such as may include at least part of one of the cores depicted in FIG. 1 in a virtual ground type configuration in accordance with an aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively.

Depending upon a signal on the word line and the connection of the bit lines in a memory cell to an electrical source or drain, the memory cells 201 through 204 are capable of writing, reading, and erasing bits at locations 215 through 222.

For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
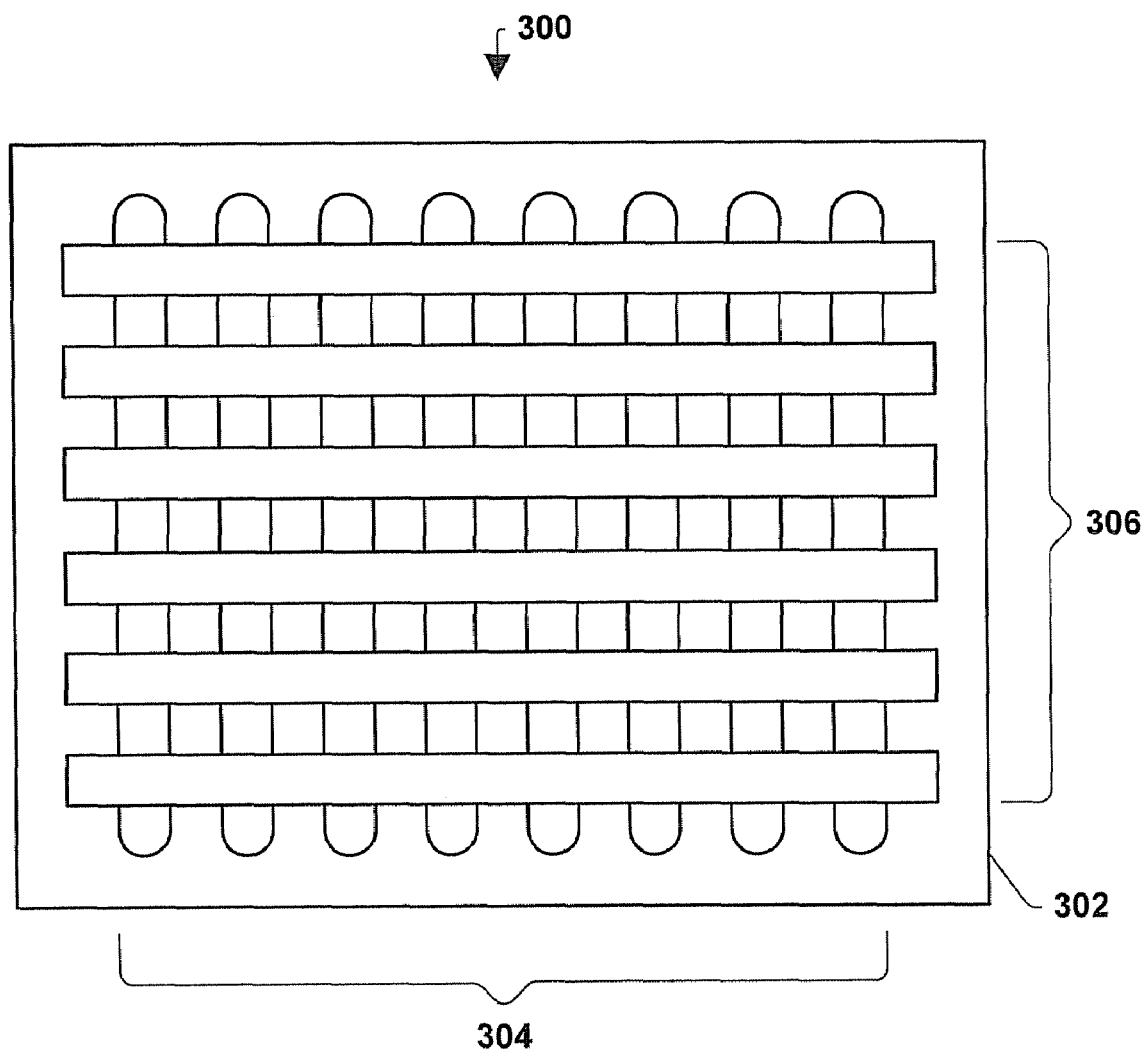
FIG. 3 is a top view of at least a portion of a memory core, such as may include at least part of one of the cores depicted in FIG. 1 in accordance with an aspect of the subject invention.

FIG. 3 illustrates a top view of at least a portion 300 of a memory core, such as may include at least part of one of the M by N array cores 104 depicted in FIG. 1. The memory core 300 is formed upon a silicon substrate 302 and has a plurality of implanted bit lines 304 extending substantially parallel to one another, and further includes a plurality of formed word lines 306 extending substantially in parallel to one another and at substantially right angles to the plurality of implanted bit lines 304. The word lines 306 are disposed over and separated from the bit lines 304 by a dielectric stack (not shown) in a grid arrangement. The memory core 300 can include a bit line contact region (not shown) between word lines 306. The bit line contact region can be used to establish electrical connection to the bit lines through the dielectric stack. It will be appreciated that the word lines 304 and bit lines 306 have contacts and interconnections (not shown) to programming circuitry such as may be represented, at least in part, by x-decoders and y-decoders.

Figure 4:
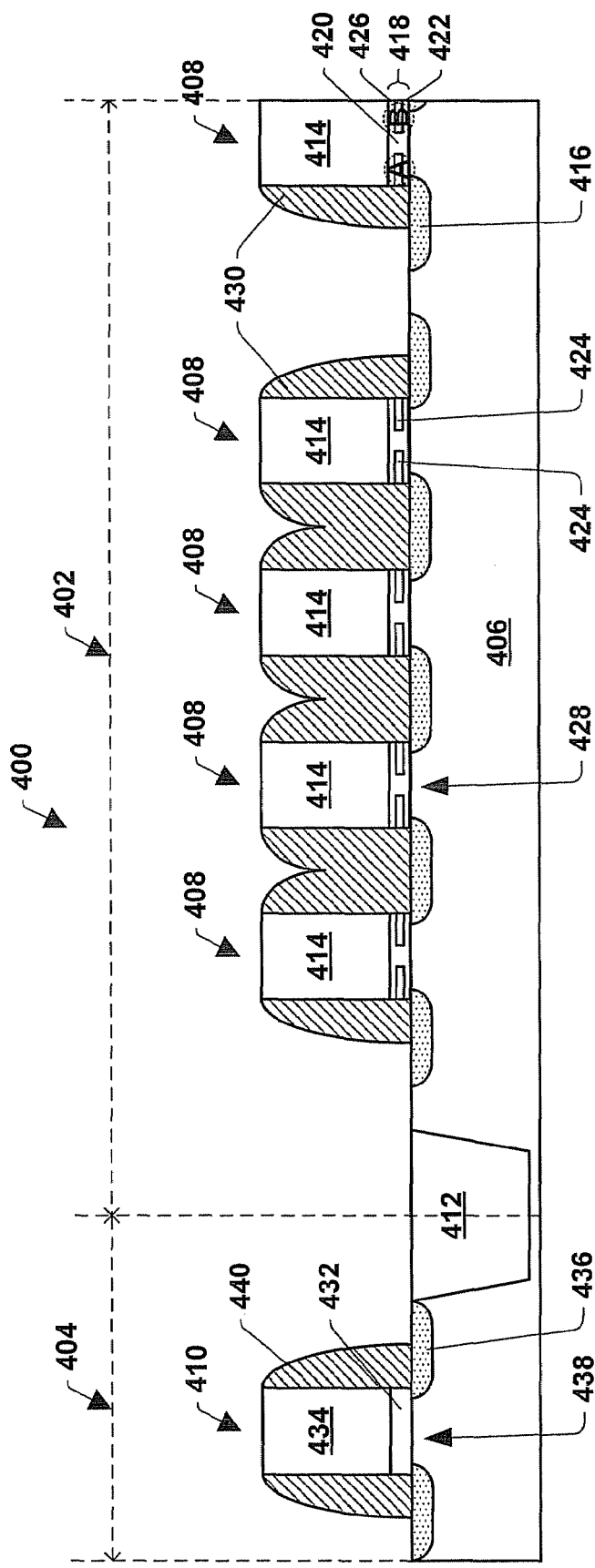
FIG. 4 illustrates a cross sectional view of an intermediate state of a portion of an exemplary memory device in accordance with an aspect of the subject invention.

Referring to FIGS. 4 to 9, one of many possible exemplary embodiments of forming a memory device is specifically illustrated. FIG. 4 illustrates a cross sectional view of an intermediate state of a portion of an exemplary memory device 400. The details of the structure and manufacture of the memory device 400 are not critical to the practice of the methods. The details of the structure and manufacture of the memory device 400 can be found in, for example, commonly-assigned U.S. Pat. No. 7,060,564, issued Jun. 13, 2006, which is hereby incorporated by reference.

The memory device 400 can contain two regions, a core region 402 and a periphery region 404 on a silicon substrate 406. The core region 402 typically contains memory cells 408. The periphery region 404 typically contains the rest of the chip, for example, transistors 410 such as the controlling logic circuitry (e.g., NMOS and/or PMOS transistors) and the input/output devices. In one embodiment, the core region 402 can include a plurality of double-bit, charge storage dielectric electrically erasable and programmable memory cells 408. The core region 402 can be separated from the peripheral region 404 by, for example, a trench isolation (e.g., shallow trench isolation (STI)) 412. The trench isolation 412 can contain any suitable dielectric material such as oxides (e.g., silicon oxides, high temperature oxides (HTO), and tetraethylorthosilicate (TEOS)).

It is to be appreciated that, while only five double-bit memory cells 408 and a single periphery transistor 410 are shown in FIG. 4, a memory device 400 can include a plurality of double-bit memory cells and a plurality of periphery transistors organized in an array of rows and columns. In one embodiment, gate electrodes 414 of each memory cell 408 in a row are coupled together to form a respective word line for that row. In addition, sources and drains for each memory cell 408 are coupled to or formed from bit lines 416 for each respective column of the array. Voltage potentials can be applied to corresponding components of each memory cell 408 using the logic circuitry in the periphery region 404.

The silicon substrate 406 contains at least silicon. The silicon substrate 406 may contain any other suitable semiconductor material on which electric devices such as memory cell transistors can be formed. Examples of semiconductor materials include gallium arsenide, indium phosphide, and the like. In one embodiment, the silicon substrate can be doped to have P-type conductivity (e.g., P dopant concentration such as boron).

In the core region 402, the memory cell 408 can contain a charge storage layer 418 on the silicon substrate 406 and the gate electrode 414 on the charge storage layer 418. The silicon substrate 406 can contain a pair of buried bit lines 416 for each memory cell 408. The buried bit line 416 can be doped to have an N-type conductivity (e.g., $N^+$ dopant concentration such as arsenic, phosphorous, and antimony). Each of the pair of the buried bit line 416 can function for a memory cell 408 as a source and a drain, respectively, during various programming, reading, and erasing operations. The roles of the source and the drain can be reversed depending on the operation and the "side" of the memory device 400 on which the operation is conducted. Therefore, the terms "source" and "drain" can be used interchangeably.

The memory cell 408 can contains a charge storage layer 418 containing two charge storage nodes on the silicon substrate 406. The two charge storage nodes are represented by the dashed circle A and the dashed circle B. In one embodiment, the two charge storage nodes are physically separated by a central dielectric 420 in the charge storage layer 418.

The configuration and/or constituent of the charge storage layer 418 may vary and are not critical to the subject invention. The charge storage layer 418 typically contains a first insulating layer 422 (e.g., a bottom dielectric layer or a tunneling dielectric layer), a charge storage dielectric material 424, and a second insulating layer 426 (e.g., a top dielectric layer). The first insulating layer 422 and/or the second insulating layer 426 can contain, for example, silicon oxide (e.g., $SiO_2$), other standard-K material (e.g., having a relative permittivity below ten), or a high-K material (e.g., having a relative permittivity, in one embodiment, above about ten and, in another embodiment, above about twenty).

The charge storage layer 418 can contain any suitable charge storage dielectric material 424. Examples of charge storage dielectric materials 424 include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the charge storage dielectric material 424 contains silicon nitride, silicon oxynitride, and/or silicon rich nitride. In another example, the charge storage material contains oxides or silicates containing Al, Ta, Hf, La, Zr, Ti, Nb, Cr, V, Y, Ce and/or Pr. The charge storage layer 418 can be formed on the silicon substrate 406 by any suitable technique. For example, the charge storage layer 418 can be formed by chemical vapor deposition (CVD), lithography, and etching techniques.

Specific examples of charge storage layer 418 include an oxide/nitride/oxide tri-layer, an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like.

In one embodiment, the first and second insulating layers contain oxide dielectrics such as silicon dioxide ($SiO_2$) and the charge storage dielectric material contains nitride dielectrics such as silicon nitride ($Si_xN_y$). The oxide-nitride-oxide configuration may be referred to as an ONO layer. Especially, when the nitride layer contains silicon rich nitride, the oxide-nitride-oxide configuration may be referred to as an ORO tri-layer. The oxide-nitride-oxide tri-layer can be fabricated by forming a first silicon oxide layer, forming a silicon nitride layer on the first silicon oxide layer, and forming a second silicon oxide layer on the silicon nitride layer.

In another embodiment, the charge storage layer 418 contains five separate layers, for example, oxide-nitride-polysilicon-nitride-oxide. The oxide-nitride-polysilicon-nitride-oxide configuration may be referred to as an ORPRO layer when the nitride layer contains silicon rich nitride.

When the memory cell 408 has the two charge storage nodes, the memory cell 408 can store two physically distinct bits. In the double-bit memory cell, within the charge storage layer 418, each memory cell 408 includes a first charge storage node represented by the dashed circle A adjacent one of the buried bit lines 416 and a second charge storage node represented by the dashed circle B adjacent the other buried bit line 416. Each bit within the memory cell 408 serves as a binary unit of data (e.g., either 1 or 0) that can be mapped directly to a memory array. Reading or programming one side of charge storage nodes occurs independently of whatever data is stored on the opposite side of the charge storage nodes.

Over the charge storage layer 418, the gate electrode 414 is formed. The gate electrode 414 can control a channel 428 within the silicon substrate 406 interposed between the pair of the buried bit lines 416. In one embodiment, although not shown, a word line can be formed over the gate electrode 414. In another embodiment, a word line is formed over the charge storage layer 418 and the word line functions as a gate electrode 414. The gate electrode 414 and/or the word line typically contain a semiconductor material (e.g., polysilicon, polycrystalline silicon-germanium, etc.) or another suitable material, such as a metal (e.g., tungsten, tantalum, aluminum, nickel, ruthenium, rhodium, palladium, platinum, titanium, molybdenum, etc.) or a metal containing compound (e.g., titanium nitride, tantalum nitride, etc.).

The memory cell 408 can contain sidewall spacers 430 adjacent lateral sidewalls of the gate electrode 414 and the charge storage layer 418 for use in controlling dopant implantation, device properties, and the like. The spacer 430 of the memory cell 408 can contain any suitable dielectric material. For example, the spacer 430 contains nitrides (e.g., silicon nitrides), oxides (e.g., silicon oxides), and the like.

The periphery transistor 410 can include any suitable type of transistors. For example, the periphery transistor 410 includes a plurality of MOSFETs (metal oxide semiconductor field effect transistor). The periphery transistor 410 can contain a gate dielectric 432, such as silicon oxide (e.g., $SiO_2$) formed over the periphery region 404 of the silicon substrate 406 and a gate electrode 434 formed over the gate dielectric 432. The gate electrode 434 can contain a semiconductor material (e.g., polysilicon, polycrystalline silicon-germanium, etc.) or another suitable material, such as a metal (e.g., tungsten, tantalum, aluminum, nickel, ruthenium, rhodium, palladium, platinum, titanium, molybdenum, etc.) or a metal containing compound (e.g., titanium nitride, tantalum nitride, etc.).

The silicon substrate 406 of the periphery region 404 can contain a pair of buried bit lines 436 and a channel 438 disposed between the bit lines 436. The bit lines 436 can be formed by implanting ion species within the silicon substrate 406. In one embodiment, the bit line contains an extension region or a lightly doped region and a deep doped region. The periphery transistor 410 can contain sidewall spacers 440 adjacent lateral sidewalls of the gate electrode 434 and the gate dielectric 432. The spacer 440 in the peripheral region 404 can contain any suitable dielectric material. For example, the spacer 440 contains nitrides (e.g., silicon nitrides), oxides (e.g., silicon oxides), and the like.

The spacer 430 of the memory cell 408 and/or the spacer 440 of the transistor 410 can be formed by any suitable method. For example, the spacer 430, 440 can be formed by forming a layer containing the spacer material over the memory device 400 and then removing portions of the spacer material layer not near the side surfaces of the gate 414 of the memory cell 408 and/or the gate 434 of the transistor 410. The layer containing the spacer material can be formed at least over the side surfaces of the gate 414, 434 of the memory cell 408 and/or the transistor 410.

The spacer material layer can be formed by any suitable technique. For example, the spacer material layer is formed using either spin-on or CVD techniques. CVD includes pulsed plasma enhanced chemical vapor deposition (PECVD) and pyrolytic CVD as well as continuous PECVD. PECVD uses continuous radio frequency (rf) power to excite the precursor gases in order to deposit films within the glow discharge region.

Portions of the spacer material layer not near the side surfaces of the gate 414, 434 of the memory cell 408 and/or the transistor 410 can be removed by any suitable technique. For example, the portions of the spacer material layer are removed by etching. In one embodiment, the portions of the spacer material layer are etched by anisotropic etching using, for example, reactive ion etching (RIE) or plasma etching. Examples of etchants include a mixture gas of chlorine, fluorine, and oxygen, a mixture gas of HBr, $O_2$ and He, and the like.

The memory device 400 can be optionally cleaned by contacting the memory device 400 with any suitable etchant under conditions that the etchant do not substantially remove or damage the components or layers of the memory device 400. In one embodiment, when the sidewall spacers 430, 440 and/or the trench isolation 412 contain nitrides, substantially any oxide on the uppermost surface of the memory device 400 is removed by contacting the memory device 400 with suitable oxide etchants such as hydrofluoric acid. In another embodiment, when the sidewall spacer 430, 440 and/or the trench isolation 412 contain oxides, substantially any nitride on the uppermost surface of the memory device 400 is removed by contacting the memory device 400 with suitable nitride etchants such as phosphoric acid.

FIG. 5 illustrates forming a mask layer 500 over the memory device 400. The mask layer 500 is patterned in a subsequent process, and the patterned mask layer 700 is used as a mask for selectively forming silicides. In one embodiment, the mask layer 500 contains any suitable material so that the patterned mask layer can serve as a mask for protecting the covered portions from the subsequent silicidation process. In another embodiment, the mask layer 500 can contain any suitable material so that the mask layer 500 can be patterned by, for example, etching in a subsequent process without substantially damaging other components of the memory cell 408 such as the spacer 430, 440 and the silicon substrate 406. That is, the material of the mask layer 500 can be selected so that there is etch selectivity between the mask layer 500 and the other components of the memory cell 408 such as the sidewall spacer 430, 440 and the silicon substrate 406.

When the memory device 400 contains sidewall spacer 430, 440, the mask layer 500 can contain a material that is different from a material of the sidewall spacer 430, 440. The mask layer material can have a higher etch rate than the sidewall spacer 430, 440 in the subsequent etching process. For example, etching rates of oxide materials are markedly higher than etching rates of nitride materials with respect to oxide etchants. Accordingly, in one embodiment, the mask layer 500 contains oxide materials when the sidewall spacer 430, 440 contains nitride materials. Examples of oxide materials include silicon oxide (e.g., $SiO_2$). In another embodiment, the mask layer 500 contains nitride materials when the sidewall spacer 430, 440 contains oxide materials since etching rates of nitride materials are markedly higher than etching rates of oxide materials with respect to nitride etchants. Examples of nitride materials include silicon oxynitride, silicon nitride, and the like. In yet another embodiment, diamond-like carbon and/or silicon carbide can be employed as a mask layer 500. The mask layer 500 can be formed by any suitable technique, for example, CVD. In one embodiment, the mask layer 500 is formed in the core region 402 and/or the peripheral region 404. In another embodiment, the mask layer 500 is formed over the entire upper surface of the memory device 400. In yet another embodiment, the mask layer 500 is formed over at least the core region 402 and the peripheral region of the memory device 400.

FIG. 6 illustrates forming a patterned resist 600 over portions of the memory device 400. The patterned resist 600 is used as a mask for patterning the mask layer 500 in a subsequent process. The patterned resist 600 can be formed by any suitable manner. For example, the patterned resist 600 is formed by forming a resist by spin-on techniques, spray techniques, CVD, and the like, over the memory device 400; exposing the resist to a pattern of radiation; and developing the resist into the pattern. For example, a resist is deposited over the memory device 400; heat is optionally applied to the resist to remove existing solvents; and when using a positive photoresist, portions of the resist are removed by exposing the resist to radiation in a suitable wavelength range. Examples of various resists include DQN resists (containing diazonaphthoquinone and a novolac polymer), chemically amplified resists (such containing a photoacid generator and a hydroxystyrene or t-butylacrylate polymer), polymethylmethacrylate resists, polyimide resists, polyester resists, melamine-formaldehyde polymers, polyvinylpyrrolidone, siloxane polymers, poly(p-tert-butoxycarbonyloxy-methylstyrene) poly (p-tert-butoxycarbonyloxystyrene), poly(tert-butyl p-vinyl benzoate), poly(tert-butyl p-isopropenylphenyloxyacetate), poly(tert-butyl methacrylate), partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, partially adamantyl substituted polymethacrylate and the like. All possible resists are not listed in the interest of brevity.

In one embodiment, upper portions of the patterned resist 600 are removed. By removing the upper portion of the resist, a desirable height of the resultant patterned resist 600 can be achieved and the patterned resist 600 can cover any suitable portion of the mask layer 500. For example, when a large amount of the upper portion is removed and the resultant patterned resist 600 has a low height, the patterned resist 600 does not cover large areas of features (e.g., the upper surface of the gate 414, 434 of the memory cell 408 and/or transistor 410). On the contrary, when a small amount of the upper portion is removed and the resultant patterned resist 600 has a high height, the patterned resist 600 covers large areas of features (e.g., the substantially entire portion of the memory cell 408 and/or transistor 410).

The upper portion can be removed by any suitable technique. For example, the upper portion is removed by, for example, chemical-mechanical polishing (CMP) and/or etch back techniques. In one embodiment, the upper portion of the resist is removed by contacting the resist with any suitable etchant that does not substantially damage and/or remove other components of the memory device 400. Wet etching and/or dry etching containing isotropic etching and/or anisotropic etching can be employed. Examples of dry etching include reactive ion etching (RIE) using, for example, a mixture gas containing HBr (e.g., HBr and $O_2$ mixture gas, HBr/$NF_3$/He and $O_2$ mixture gas, $SF_6$, HBr and $O_2$ mixture gas). The mixture may further include $Cl_2$.

The patterned resist 600 can cover any suitable portion of the memory device 400. In this example, the patterned resist 600 covers the silicon substrate 406 of the core region 402 where the memory cells 408 do not locate. In another embodiment, when the memory device 400 contains integrated circuit elements (not shown) such as doped portions of the silicon substrate 406, the patterned resist 600 covers such integrated circuit elements in a core region 402 and/or a peripheral region 404.

Any suitable amount of the upper portion of the patterned resist 600 can be removed. As a result, the patterned resist 600 can have any suitable height so that the patterned resist 600 can protect the covered portions of the mask layer 500 from a subsequent mask patterning process. In one embodiment, the height of the uppermost surface of the patterned resist 600 is lower than the heights of the upper surfaces of the gates 414, 434, of the memory cell 408 and/or the transistor 410. In another embodiment, the height of the uppermost surface of the patterned resist 600 is substantially equal to the heights of the upper surfaces of the gates 414, 434, of the memory cell 408 and/or the transistor 410. In yet another embodiment, the height of the uppermost surface of the patterned resist 600 is higher than the heights of the upper surfaces of the gates 414, 434, of the memory cell 408 and/or the transistor 410.

FIG. 7 illustrates patterning the mask layer 500, thereby forming a patterned mask layer 700. The mask layer 500 can be patterned by removing portions of the mask layer 500 that are not covered by the patterned resist 600. The exposed portions of the mask layer 500 can be removed by any suitable technique, for example, etching. For example, when the mask layer 500 contains oxides, the exposed portions of the mask layer 500 are removed by contacting the mask layer 500 with any suitable oxide etchant. Examples of oxide etchants include halogen acids such as hydrofluoric acid. In one embodiment, the oxide etchant is a hydrofluoric acid solution. In another embodiment, the oxide etchant is a vapor of hydrofluoric acid. When the mask layer 500 contains nitrides, the exposed portions of the mask layer 500 are removed by contacting the mask layer 500 with any suitable nitride etchant. Examples of nitride etchants include phosphoric acid. The mask layer 500 is contacted with a suitable etchant under conditions that the etchant does not substantially remove or damage other components and/or layers of the memory device 400 such as the sidewall spacer 430, 440. The patterned resist 600 can be removed after forming the patterned mask layer 700 by any suitable technique, for example, etching.

The patterned mask layer 700 can cover any suitable portion of the memory device 400. In this example, the patterned mask layer 700 covers the silicon substrate 406 of the core region 402 where the memory cells 408 do not locate. In another embodiment, when the memory device 400 contains integrated circuit elements (not shown) such as doped portions of the silicon substrate 406, the patterned mask layer 700 covers such integrated circuit elements in a core region 402 and/or a peripheral region 404.

FIG. 8 illustrates forming a metal layer 800 over the memory device 400. The metal layer 800 can contain any suitable metal compound that can be converted to metal silicides in a subsequent process. Examples of metals include refractory metals, such as tungsten, tantalum, molybdenum and the like; and metals of Group VIII of the Periodic Table, such as platinum, palladium, cobalt, nickel, and the like. The metal layer 800 can be converted to form, in a subsequent heat treatment, a metal silicide compound with underlying silicon in, for example, the silicon substrate 406 (e.g., bit lines 416) and/or in the gate electrode 414, 434. The metal layer 800 can be formed by any suitable technique, for example, CVD, physical vapor deposition (PVD), and the like. The metal layer 800 can have any suitable thickness that depends on, for example, a desired thickness of the metal silicide formed in the subsequent process.

Figure 9:
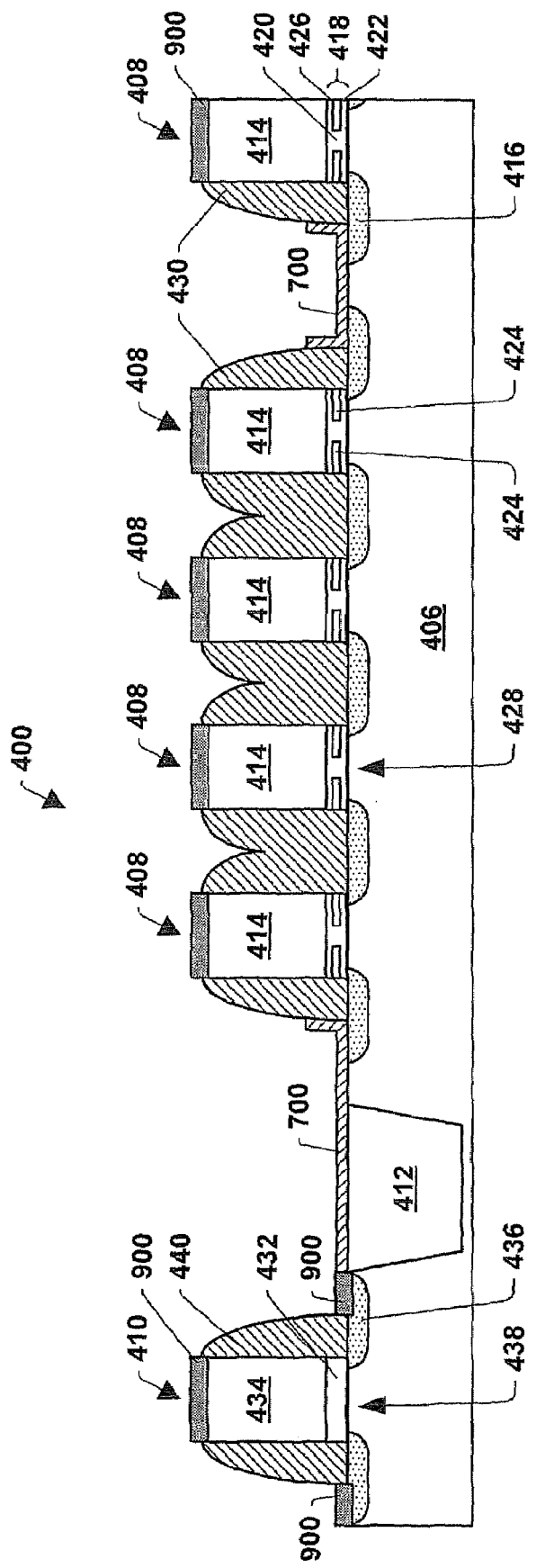
FIG. 9 illustrates forming metal silicides on portions of a memory device in accordance with an aspect of the subject invention.

FIG. 9 illustrates forming metal silicides 900 on portions of the memory device 400 that are not covered with the patterned mask layer 700 and removing unreacted portions of the metal layer 800. When the memory device 400 contains spacers 430, 440, metal silicides can be formed on portions of the memory device 400 that are not covered with the patterned mask layer 700 and the spacers 430, 440. The metal silicides 900 can be formed by any suitable technique. For example, the metal silicides 900 are formed by heating the metal layer 800 to cause a chemical reaction between the metal layer 800 and the underlying silicon containing layer/component of the memory device 400. In one embodiment, the metal silicides 900 are formed by chemical reactions of the metal layer 800 with the silicon of the underlying silicon substrate 406 (e.g., bit lines 416) and/or with the polysilicon of the gate electrodes (e.g., gate electrodes 414 of memory cells 408 and/or gate electrodes 434 of transistors 410). During the silicidation process, the metal of the metal layer 800 can diffuse into the underlying silicon containing layer/component and form the metal silicides 900. At the same time, the patterned mask layer 700 and/or the sidewall spacer 430, 440 can prevent silicidation of portions of the memory device 400 that are covered by the patterned mask layer 700 and the sidewall spacer 430, 440. As a result, the metal silicides 900 can be selectively formed on the memory device 400. The metal silicides can have any suitable height that depends on, for example, the desired implementations and/or the memory device 400 being fabricated.

Choice of suitable conditions and parameters (e.g., temperature, duration of heat treatment, and the like) of the silicidation process depends on, for example, the desirable dimensions (e.g., height) of the metal silicides 900, the configuration and/or constituent of the metal layer 800 and/or the underlying silicon containing component/layer, the desired implementations and/or the memory device 400 being fabricated, and the like. For example, the metal silicides are formed by rapid thermal annealing (RTA).

Portions of the metal layer 800 over the patterned mask layer 700 remain unreacted and can be removed by, for example, etching. When the memory device 400 contains sidewall spacers 430, 440, portions of the metal layer 800 over the sidewall spacer 430, 440 also remain unreacted and can be removed by, for example, etching. The unreacted portions of the metal layer 800 can be removed by contacting the unreacted metal portions with any suitable metal etchant that does not substantially affect or damage the integrity of other layers/components of the memory device 400 such as the metal silicides 900, the memory cells 408, the transistors 410, the sidewall spacers 430, 440, and the like. Examples of metal etchants include an oxidizing etchant solution. Examples of oxidizing etchants include an acidic solution containing, for example, $H_2SO_4/H_2O_2$, $HNO_3/H_2O_2$, $HCl/H_2O_2$, $H_2O_2/NH_4OH/H_2O$, $H_3PO_4$, $HNO_3$, $CH_3COOH$, and the like.

Other metal etchants can also be used as long as they are capable of removing the unreacted portions of the metal layer 800 selective to other components/layers of the memory device 400.

The silicidation process and the unreacted metal removing process can be performed at any suitable number of times. For example, when using cobalt, in a first silicidation process, cobalt silicides are formed by reacting portions of a cobalt layer and the underlying silicon containing layer/component of the memory device 400. Subsequently the non-reacted cobalt is removed by a selective wet etch process. Thereafter, in a second silicidation process with a higher temperature than the temperature of the first silicidation process, the cobalt silicides can be transformed into low-ohmic cobalt disilicides.

Although not shown in FIG. 9, the patterned mask layer 700 and/or the sidewall spacer 430, 440 can be removed from the memory device 400 after the silicidation process. In one embodiment, removing the sidewall spacer 430, 440 may be advantageous to allow other structural arrangements that increase device performance. For example, removing the sidewall spacers containing silicon dioxide or silicon nitride and forming an interlayer dielectric (ILD) containing low k dielectric material can enhance device performance, by reducing, for example, overlap capacitance between the gate and source and between the gate and drain.

In one embodiment, when the memory device 400 contains sidewall spacers 430, 440, the patterned mask layer 700 and the sidewall spacer 430, 440 have the substantially same etch selectivity. For example, the patterned mask layer 700 and the sidewall spacer 430, 440 contain oxides (e.g., silicon oxides) and can be removed by oxide etchants at the same time. Alternatively, the patterned mask layer 700 and the sidewall spacer 430, 440 contain nitrides (e.g., silicon nitrides) and can be removed by nitride etchants at the same time. In another embodiment, the patterned mask layer 700 has an etch selectivity substantially different from an etch selectivity of the sidewall spacer 430, 440. For example, the patterned mask layer 700 contains oxides and the sidewall spacer 430, 440 contains nitrides. The oxide patterned mask layer 700 can be removed selectively by using oxide etchants without substantially damaging (e.g., removing, ablating) the nitride sidewall spacer 430, 440. Alternatively, the patterned mask layer 700 contains nitrides and the sidewall spacer 430, 440 contains oxides. The nitride patterned mask layer 700 can be removed selectively by using nitride etchants without substantially damaging the oxide sidewall spacer 430, 440.

The metal silicides 900 can have a significantly lower sheet resistance than silicon and polysilicon, even if heavily doped. The metal silicides 900 formed on the polysilicon containing gate 434 is generally referred to as a polycide gate, which significantly reduces the resistance of the gate structure, as compared to a polysilicon gate. As a result, the overall conductivity of the gate electrode 414, 434 may be increased. Since many of the metals mentioned above exhibit the characteristic of reacting with silicon but substantially do not react with the mask layer such as silicon dioxide, the process may be considered "self-aligned," especially as the non-reacted metal may be readily removed selectively to the metal silicides 900 and selectively to silicon and silicon oxide.

Figure 10:
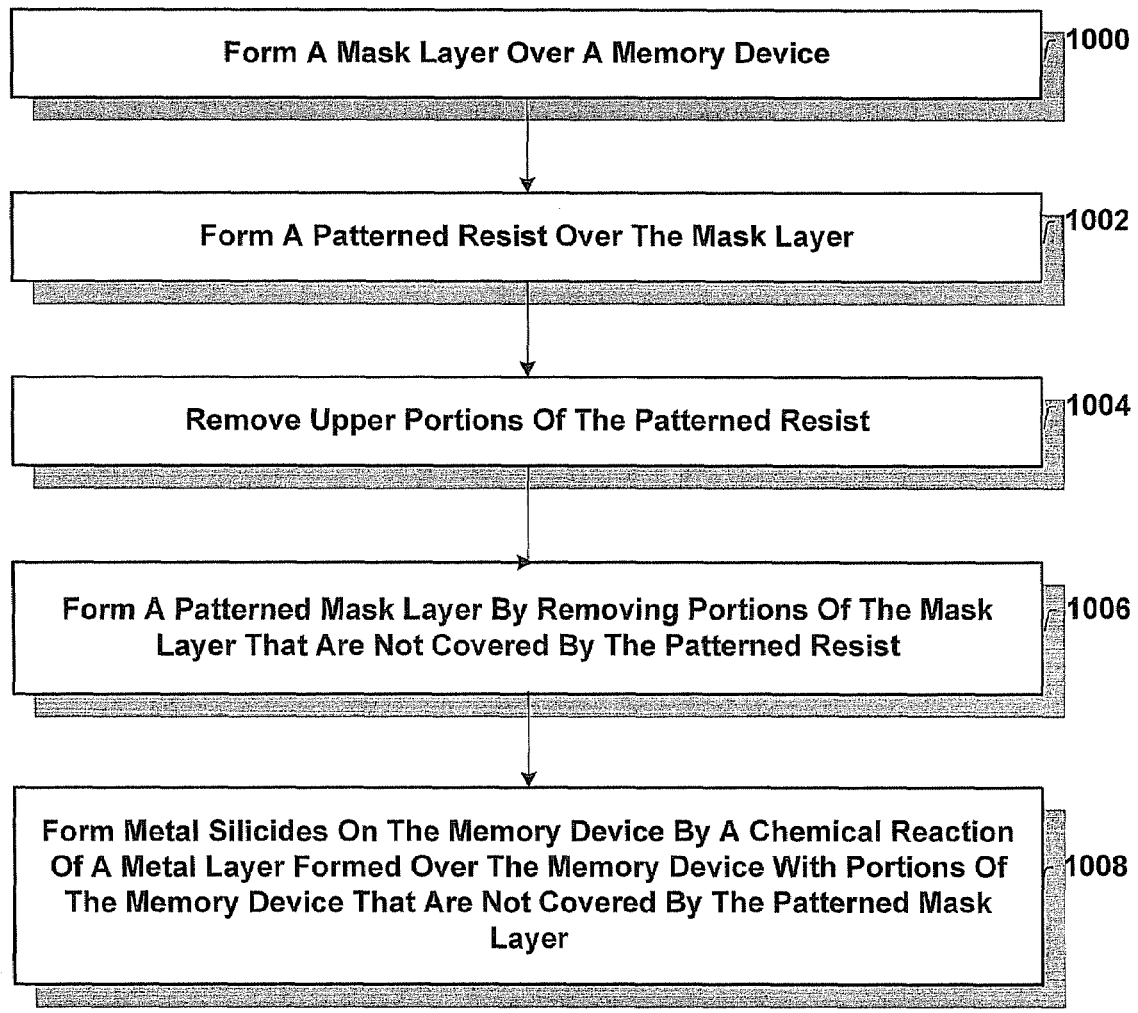
FIG. 10 illustrates an exemplary methodology of selectively forming metal silicides on a memory device in accordance with an aspect of the subject invention.

FIG. 10 illustrates an exemplary methodology of selectively forming metal silicides on a memory device. At 1000, a mask layer is formed over the memory device. At 1002, a patterned resist is formed over the mask layer. At 1004, upper portions of the patterned resist are removed. At 1006, a patterned mask layer is formed by removing portions of the mask layer that are not covered by the patterned resist. At 1008, metal silicides are formed on the memory device by a chemical reaction of a metal layer formed over the memory device with portions of the memory device that are not covered by the patterned mask layer. Metal silicides are not formed where the metal layer is not contacted with silicon containing layers/components of the memory device due to the patterned mask layer. In one embodiment, the memory device contains spacers (e.g., sidewall spacers). When the memory device contains sidewall spacers, the patterned mask layer contains a material that is different from a material of the spacer, and after forming the metal silicides, either of the patterned mask layer or the spacer can be independently removed by, for example, etching.

Although not shown in FIG. 10, the methodology may include any suitable memory device fabrication processes. General examples of memory device fabrication processes include masking, patterning, etching, cleaning, planarization, thermal oxidation, implant, annealing, thermal treatment, and deposition techniques normally used for making memory devices.

The resultant memory device formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory device formed herein is useful in any electronic device. For example, the resultant memory device is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A method of selectively forming metal silicides on a memory device, comprising:
    forming sidewall spacers adjacent lateral sidewalls of gates of memory cells and transistors of the memory device;
    forming a mask layer over the sidewall spacer and the memory device, the mask layer comprising a material that is different from a material of the sidewall spacer;
    forming a patterned resist over the mask layer, the height of the uppermost surface of the patterned resist being lower than the height of the uppermost surface of the gates and the height of the uppermost portion of the spacers;

forming a patterned mask layer by removing portions of the mask layer that are not covered by the patterned resist; and forming metal silicides on the memory device by a chemical reaction of a metal layer formed on the memory device with portions of the memory device that are not covered by the patterned mask layer.

2. The method of claim 1, wherein the sidewall spacer comprises nitride materials and the mask layer comprises oxide materials.

3. The method of claim 1, wherein the sidewall spacer comprises oxide materials and the mask layer comprises nitride materials.

4. The method of claim 1, wherein the sidewall spacer comprises silicon nitride and the patterned mask layer comprises silicon dioxide.

5. The method of claim 1, wherein the memory device comprises a charge storage layer comprising a first insulating layer, a charge storage dielectric material, and a second insulating layer.

6. The method of claim 5, wherein the charge storage layer further comprising a central dielectric therein.

7. The method of claim 5, wherein the charge storage dielectric material comprises silicon rich nitride.

8. The method of claim 1, wherein the patterned resist does not cover upper surfaces of the gates and does not cover upper portions of the sidewall spacers.

9. The method of claim 1, wherein the patterned mask layer does not cover upper surfaces of the gates and does not cover upper portions of the sidewall spacers.

10. A method of selectively forming metal silicides on a memory device, comprising:

forming spacers comprising nitrides adjacent side surfaces of gates of memory cells and transistors of the memory device, the memory cell comprising a charge storage layer comprising a central dielectric therein, the charge storage layer further comprising a first insulating layer, a charge storage dielectric material, and a second insulating layer;

forming a mask layer comprising oxides over the sidewall spacer and the memory device;

forming a patterned resist over the mask layer, the height of the uppermost surface of the patterned resist being lower than the height of the uppermost surface of the gates and the height of the uppermost portion of the spacers;

forming a patterned mask layer by removing portions of the mask layer that are not covered by the patterned resist; and forming metal silicides on the memory device by a chemical reaction of a metal layer formed over the memory device with portions of the memory device that are not covered by the patterned mask layer.

11. The method of claim 10, wherein the patterned mask layer comprises silicon dioxide.

12. The method of claim 10, wherein upper portions of the patterned resist are removed by an etch back process so that the height of the uppermost surface of the patterned resist is lower than the height of the uppermost surface of the gates and the height of the uppermost portion of the spacers.

13. The method of claim 10, wherein the charge storage dielectric material comprises silicon rich nitride.

14. The method of claim 10, wherein the patterned resist does not cover upper surfaces of the gates and does not cover upper portions of the spacers.

15. The method of claim 10, wherein the patterned mask layer does not cover upper surfaces of the gates and does not cover upper portions of the spacers.

16. The method of claim 10, wherein the portions of bottom surface of the mask layer are in contact with the nitrides of upper surface of the sidewall spacer and the bottom surface of patterned resist is in contact with the oxides of upper surface of mask layer.

17. A method of selectively forming metal silicides on a memory device, comprising:

forming sidewall spacers comprising nitrides adjacent lateral sidewalls of gates of memory cells and transistors of the memory device;

forming only one mask layer comprising oxides over the sidewall spacer and the memory device, portions of the bottom surface of mask layer being in contact with the upper surface of sidewall spacer;

forming a patterned resist over the only one mask layer, the bottom surface of patterned resist being in contact with the upper surface of mask layer;

removing upper portions of patterned resist so that the height of uppermost surface of the patterned resist is lower than the height of uppermost surface of gates and the height of the uppermost portion of the spacers;

forming only one patterned mask layer by removing portions of the only one mask layer that are not covered by the patterned resist; and forming metal silicides on the memory device by a chemical reaction of a metal layer formed on the memory device with portions of the memory device that are not covered by the patterned mask layer.

18. The method of claim 17, wherein the patterned resist does not cover upper surfaces of the gates and does not cover upper portions of the sidewall spacers.

19. The method of claim 17, wherein the patterned mask layer does not cover upper surfaces of the gates and does not cover upper portions of the sidewall spacers.

20. The method of claim 17, wherein the portions of bottom surface of the mask layer are in contact with the nitrides of upper surface of the sidewall spacer and the bottom surface of patterned resist is in contact with the oxides of upper surface of mask layer.

* * * * *